United States Patent
Lin

(10) Patent No.: US 9,019,738 B2
(45) Date of Patent: Apr. 28, 2015

(54) MEMORY DEVICE HAVING SEQUENTIALLY CASCADING DICES

(71) Applicant: Eorex Corporation, Zhubei, Hsinchu County (TW)

(72) Inventor: Cheng-Lung Lin, Hsinchu County (TW)

(73) Assignee: Eorex Corporation, Zhubei, Hsinchu County (TW)

( * ) Notice: Subject to any disclaimer, the term of this patent is extended or adjusted under 35 U.S.C. 154(b) by 0 days.

(21) Appl. No.: 14/133,844

(22) Filed: Dec. 19, 2013

(65) Prior Publication Data
US 2015/0055392 A1 Feb. 26, 2015

(30) Foreign Application Priority Data
Aug. 23, 2013 (TW) .............................. 102130138 A

(51) Int. Cl.
G11C 5/02 (2006.01)
G11C 5/06 (2006.01)
H01L 25/065 (2006.01)

(52) U.S. Cl.
CPC ........ *G11C 5/025* (2013.01); *G11C 5/06* (2013.01); *H01L 25/0657* (2013.01)

(58) Field of Classification Search
CPC .. H01L 25/0657; H01L 23/528; G11C 5/025; G11C 5/04
USPC ................... 365/63, 148, 51; 257/678, 686
See application file for complete search history.

(56) References Cited

U.S. PATENT DOCUMENTS

| 7,402,897 B2* | 7/2008 | Leedy ............................ 257/678 |
| 7,602,056 B2* | 10/2009 | Zhao et al. .................... 257/678 |
| 2013/0040494 A1* | 2/2013 | Mische et al. ........... 439/620.26 |

* cited by examiner

Primary Examiner — David Lam
(74) Attorney, Agent, or Firm — Jackson IPG PLLC; Demian K. Jackson

(57) ABSTRACT

A memory device is provided. The memory device is used for data transmission at around 1600 megahertz (MHz). A wire layout is used to sequentially cascade memory dices with greatly shortened distances between the wire layout and the memory dices. At the same time, distances between the wire layout and UA controllers are shortened as well for effectively simplifying the design of wires.

6 Claims, 9 Drawing Sheets

MEMORY DEVICE HAVING SEQUENTIALLY CASCADING DICES

TECHNICAL FIELD OF THE INVENTION

The present invention relates to a memory device; more particularly, relates to using a wire layout to sequentially cascade memory dices with greatly shortened distances between the wire layout and the memory dices and shortened distances between the wire layout and unit address (UA) controllers as well for effectively simplifying the design of wires.

DESCRIPTION OF THE RELATED ART

A general memory device is set with a plurality of memory dices on a substrate. After the memory dices are set, pins of the dices are connected with each other through wire bonding for packaging.

Generally, the dices are arranged around the substrate and the pins of the dices are directly wire-bound without a good design of wire layout. Although the procedure of direct wire-bonding is flexible, the running of the wires may become complex and the distances between the wires and the wire layout may be prolonged. As a result, complexity of the producing procedure is increased and the memory device is not suitable to be operated under a high frequency (more than 1600 megahertz (MHz)).

Hence, the prior art does not fulfill all users' requests on actual use.

SUMMARY OF THE INVENTION

The main purpose of the present invention is to use a wire layout to sequentially cascade memory dices with greatly shortened distances between the wire layout and the memory dices and shortened distances between the wire layout and UA controllers as well for effectively simplifying the design of wires.

To achieve the above purpose, the present invention is a memory device having sequentially cascading dices to be used for data transmission at around 1600 MHz, comprising a substrate, a plurality of memory dices, a wire layout, a processing unit and a reflective signal absorption unit, where the memory dices are set on at least one surface of the substrate; the memory dices have UA controllers correspondingly arranged in array; the wire layout uses the UA controllers to sequentially cascade the memory dices; the processing unit is located at an end of the wire layout; and the reflective signal absorption unit is located at another end of the wire layout. Accordingly, a novel memory device having sequentially cascading dices is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is the perspective view showing the first preferred embodiment according to the present invention;

DESCRIPTION OF THE PREFERRED EMBODIMENTS

The following descriptions of the preferred embodiments are provided to understand the features and the structures of the present invention.

Figure 1:
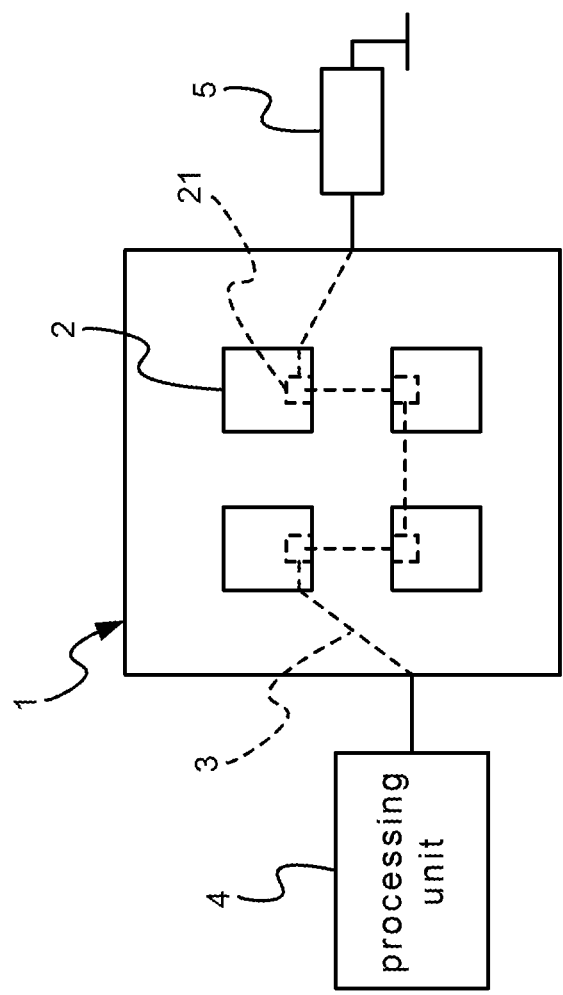
Figure 2:
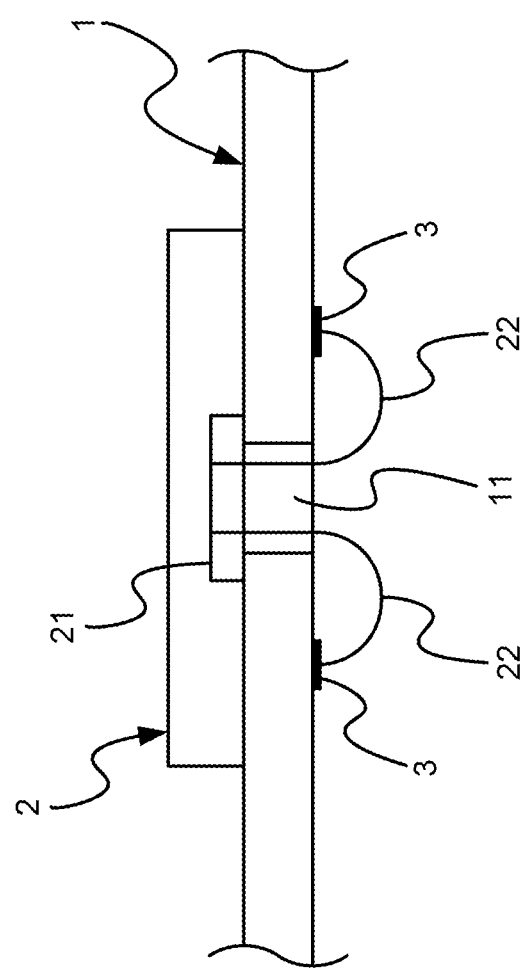
FIG. 2 is the sectional view showing the first preferred embodiment.
Figure 3:
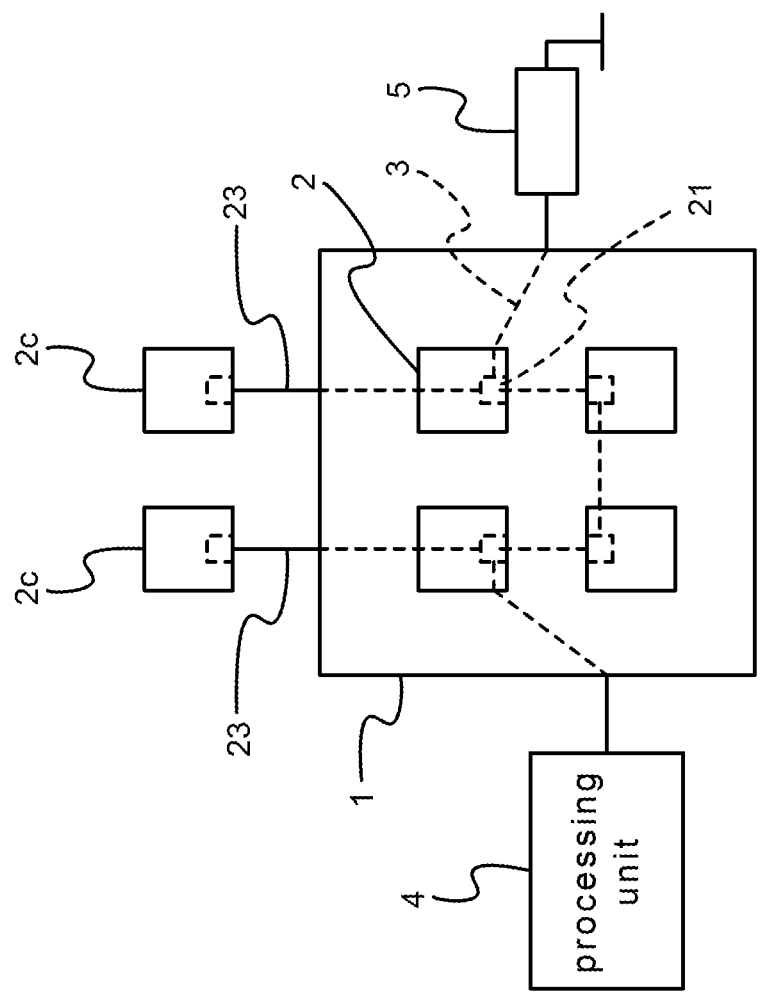
FIG. 3 is the view showing the state-of-use of the first preferred embodiment.

Please refer to FIG. 1 to FIG. 3, which are a perspective and a sectional views showing a first preferred embodiment according to the present invention; and a view showing a state-of-use of the first preferred embodiment. As shown in the figures, the present invention is a memory device having sequentially cascading dices to be used for data transmission at around 1600 megahertz (MHz), comprising a substrate 1, a plurality of memory dices 2, a wire layout 3, a processing unit 4 and a reflective signal absorption unit 5.

The substrate 1 is set with a plurality of penetrating holes 11.

The memory dices 2 are set on a surface of the substrate 1. The memory dices 2 have unit address (UA) controllers 21 correspondingly arranged in array.

The wire layout 3 sequentially cascades the memory dices 2 to form an 'Ω' shape on another surface of the substrate 1 for connecting the UA controllers 21 with the wire layout 3 by conducting wires 22 through the corresponding penetrating holes 11, where the wire layout 3 is a bus.

The processing unit 4 is set at an end of the wire layout 3 as a controlling center for the memory dices 2.

The reflective signal absorption unit 5, which is a resistance, is set at another end of the wire layout 3.

Thus, a memory device having sequentially cascading dices is obtained.

On fabricating the present invention, the 'Ω'-shaped wire layout 3 greatly reduces distances between the memory dices 2 and the wire layout 3. Hence, the present invention can be applied in related fields of DRAM, NAND, MRAM, NOR and SRAM. Therein, the processing unit 4 transfers signals with the coordination of the memory dices 2 and the wire layout 3; and, on transferring the signals, the reflective signal absorption unit 5 is used to absorb reflective signals for stable operation of the memory dices 2. The UA controllers 21 of the neighboring memory dices 2 can be corresponding to each other, so that every UA controller 21 is close to the center. Thus, the wire layout 3 between the UA controllers 21 is shortened for effectively simplifying the design of wires.

On using the present invention, at least one of the UA controllers 21 is connected with an outside memory dice 2c with a wire 23. Thus, the present invention can be connected with other memory dices 2c according to requirement to form a memory structure connected with extra memory dices.

Figure 4:
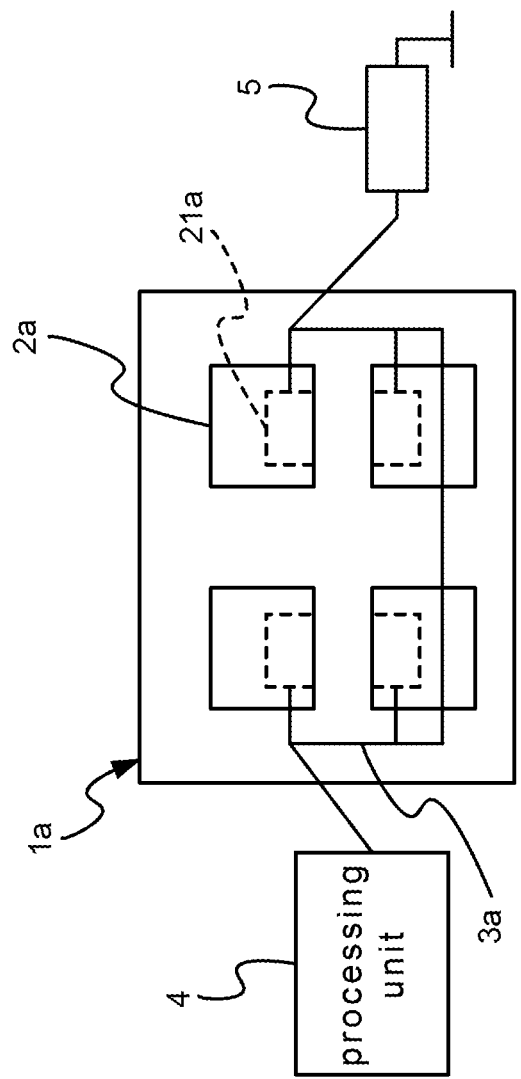
FIG. 4 is the perspective view showing the second preferred embodiment.
Figure 5:
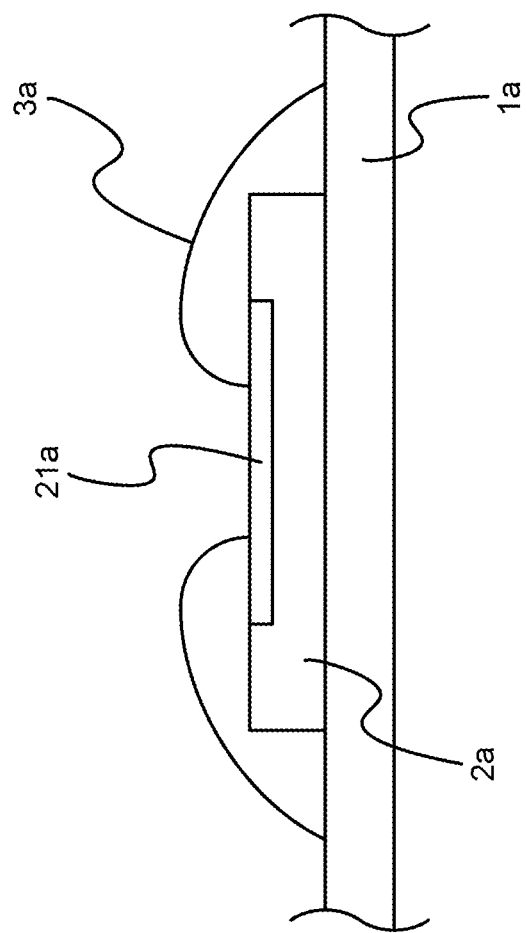
FIG. 5 is the sectional view showing the second preferred embodiment.

Please refer to FIG. 4 and FIG. 5, which are a perspective and a sectional views showing a second preferred embodiment. As shown in the figures, a substrate 1a has no penetrating hole. Memory dices 2a are set in array on a surface of the substrate 1a. Then, an 'Ω'-shaped wire layout 3a is used to connect UA controllers 21 of the memory dices 2a, where the memory dices 2a and the wire layout 3 are further located on the same surface of the substrate 1a.

Figure 6:
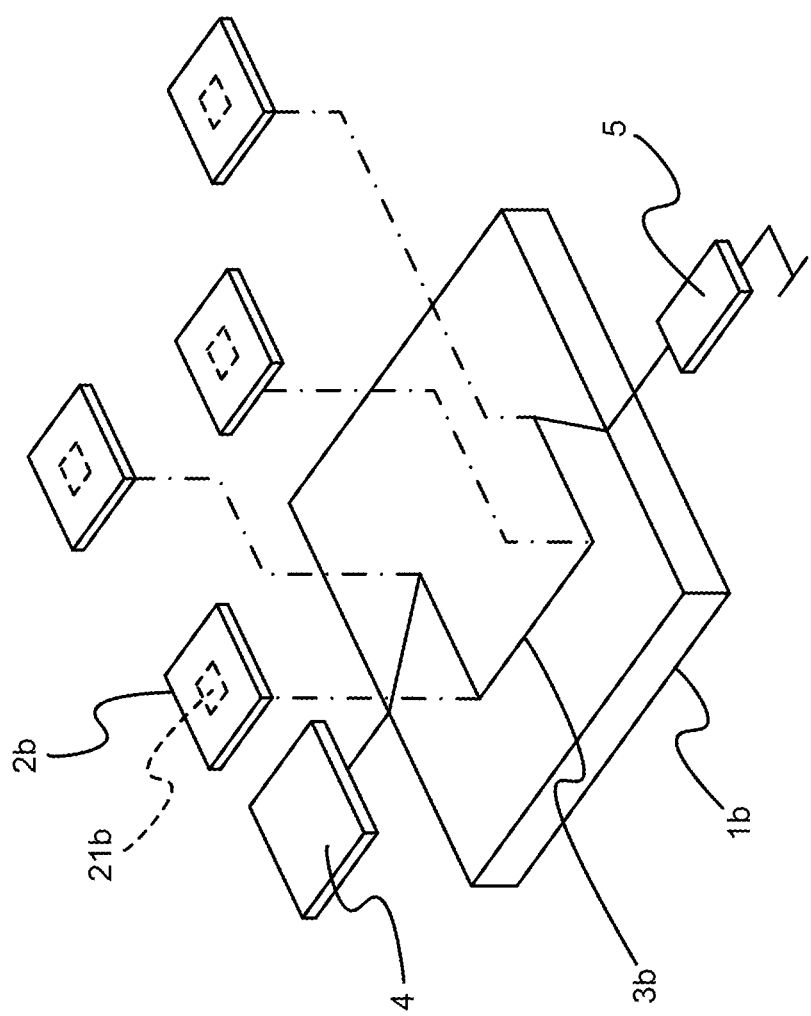
FIG. 6 is the explosive view showing the third preferred embodiment.
Figure 7:
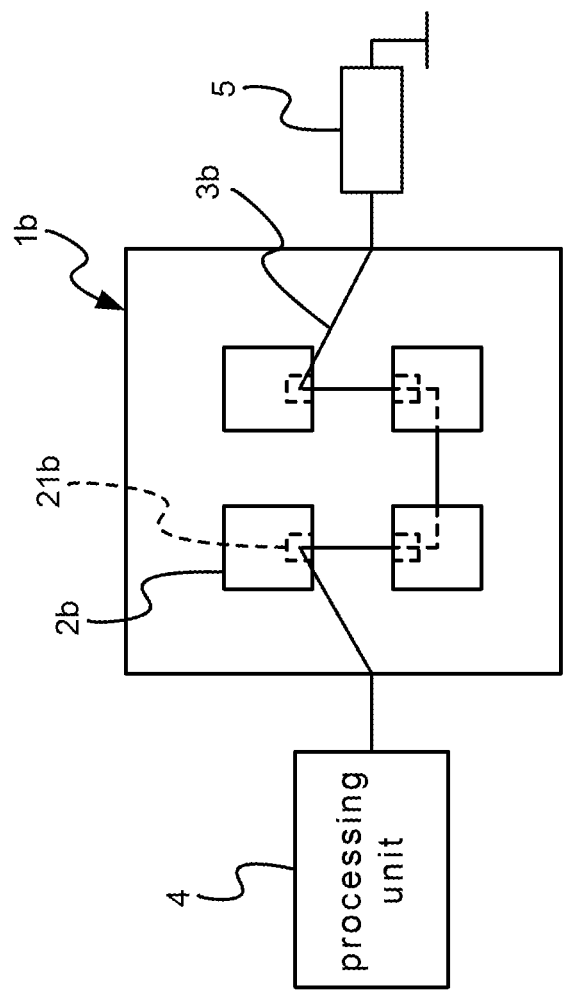
FIG. 7 is the perspective view showing the third preferred embodiment.

Please refer to FIG. 6 and FIG. 7, which are an explosive and a perspective views showing a third preferred embodiment. As shown in the figures, a wire layout 3b sequentially cascades memory dices 2b to form an 'Ω' shape on a surface of a substrate 1b, where the memory dices 2b are directly combined with the wire layout 3b through corresponding UA controllers 21.

Figure 8:
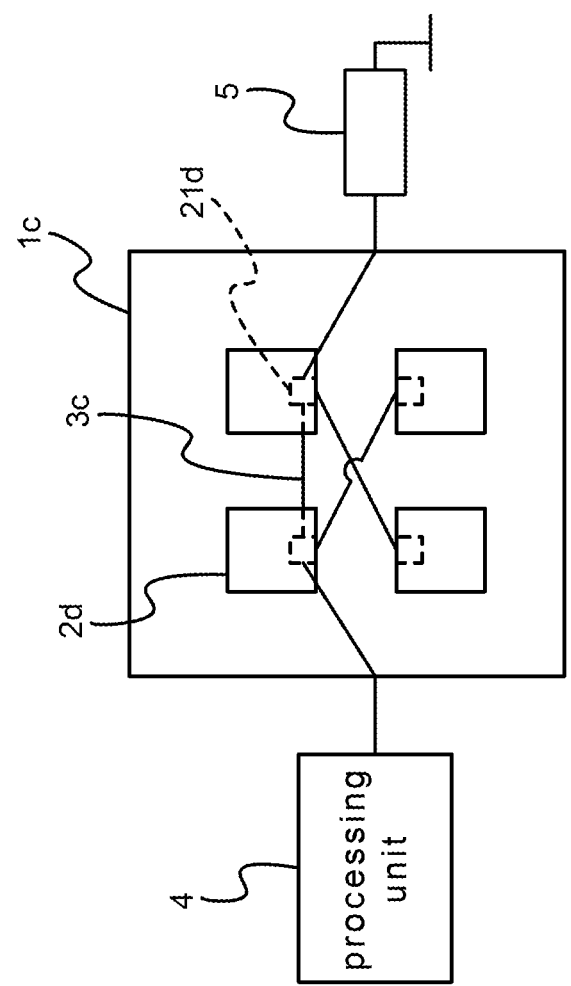
FIG. 8 is the perspective view showing the fourth preferred embodiment.
Figure 9:
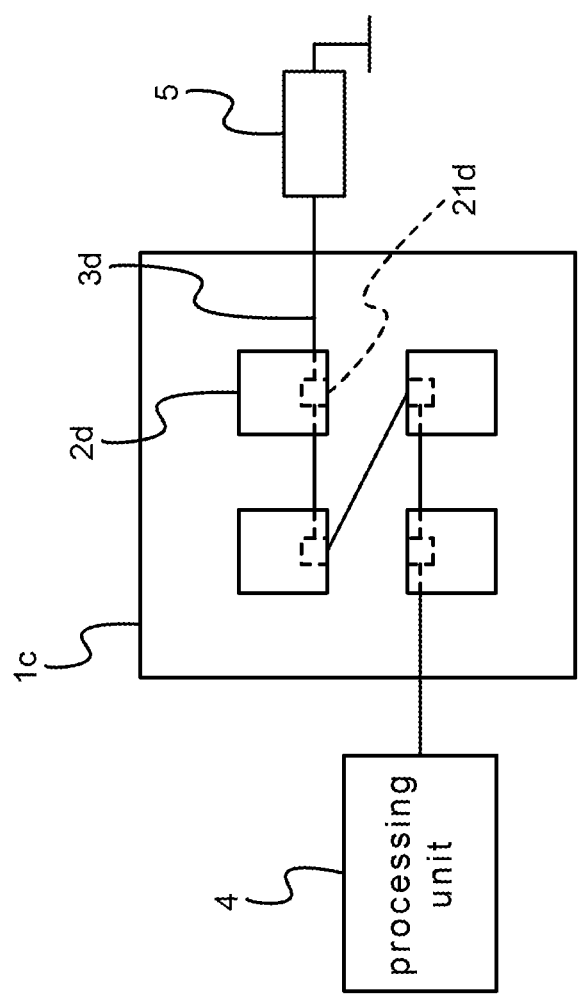
FIG. 9 is the perspective view showing the fifth preferred embodiment.

Please refer to FIG. 8 and FIG. 9, which are a perspective view showing a fourth and a fifth preferred embodiments. As shown in the figures, a substrate 1c has no penetrating holes. Memory dices 2d are set in array on a surface of the substrate 1c. Then, a wire layout 3c,3d connects UA controllers 21d of the memory dices 2d to form a cross or mirrored-'Z' shape. Or, the wire layout 3c,3d is directly formed into a cross or mirrored-'Z' shape on the surface of the substrate 1c and the memory dices 2d are directly correspondingly combined with the wire layout 3c,3d through the corresponding UA controllers 21d.

To sum up, the present invention is a memory device having sequentially cascading dices, where a wire layout sequentially cascades memory dices with greatly shortened distances between the wire layout and the memory dices and distances between the wire layout and UA controllers are shortened as well for effectively simplifying the design of wires.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A memory device having sequentially cascading dices, comprising
   a substrate;
   a plurality of memory dices, said memory dices being located on at least one surface of said substrate, said memory dices having unit address (UA) controllers correspondingly arranged in array;
   a wire layout, said wire layout using said UA controllers to sequentially cascade said memory dices;
   a processing unit, said processing unit being located at an end of said wire layout; and
   a reflective signal absorption unit, said reflective signal absorption unit being located at another end of said wire layout,
      wherein said substrate has a plurality of penetrating hole; said memory dices are located on a surface of said substrate; said UA controllers are separately corresponding to said penetrating holes; said wire layout is located on another surface of said substrate to form an 'Ω' shape; and said UA controller is connected with said wire layout by a conducting wire through said corresponding penetrating hole.

2. The memory device according to claim 1,
   wherein said UA controller is a pin.

3. The memory device according to claim 1,
   wherein said wire layout is a bus.

4. The memory device according to claim 1,
   wherein said UA controllers of neighboring memory dices are corresponding to each other.

5. The memory device according to claim 1,
   wherein said reflective signal absorption unit is a resistance.

6. A memory device having sequentially cascading dices, comprising a substrate;
   a plurality of memory dices, said memory dices being located on at least one surface of said substrate, said memory dices having unit address (UA) controllers correspondingly arranged in array;
   a wire layout, said wire layout using said UA controllers to sequentially cascade said memory dices;
   a processing unit, said processing unit being located at an end of said wire layout; and
   a reflective signal absorption unit, said reflective signal absorption unit being located at another end of said wire layout,
   wherein said wire layout is directly obtained on a surface of said substrate to form an 'Ω' shape; and said memory dice is combined with said wire layout through said corresponding UA controller.

* * * * *